(12) United States Patent
Haino et al.

(10) Patent No.: US 6,383,333 B1
(45) Date of Patent: May 7, 2002

(54) PROTECTIVE MEMBER FOR INNER SURFACE OF CHAMBER AND PLASMA PROCESSING APPARATUS

(75) Inventors: Kazuyoshi Haino, Chigasaki; Koichi Kazama, Nirasaki, both of (JP)

(73) Assignees: Tokai Carbon Company, Ltd.; Tokyo Electron Ltd., both of Tokyo (JP)

( * ) Notice: Subject to any disclaimer, the term of this patent is extended or adjusted under 35 U.S.C. 154(b) by 0 days.

(21) Appl. No.: 09/673,985

(22) PCT Filed: Apr. 27, 1999

(86) PCT No.: PCT/JP99/02332

§ 371 Date: Oct. 23, 2000

§ 102(e) Date: Oct. 23, 2000

(87) PCT Pub. No.: WO99/56309

PCT Pub. Date: Nov. 4, 1999

(30) Foreign Application Priority Data

Apr. 28, 1998 (JP) .......................................... 10-119022

(51) Int. Cl.[7] .................................................. C23F 1/02
(52) U.S. Cl. .................................... 156/345; 118/723 R
(58) Field of Search .................. 156/345; 118/723 R, 118/504, 723 MW, 723 MR, 723 MA, 723 ME, 723 E, 723 ER, 723 I, 723 IR, 723 AN; 204/298.11

(56) References Cited

U.S. PATENT DOCUMENTS 6,197,151 B1 * 3/2001 Kaji et al. .................. 156/345

6,308,654 B1 * 10/2001 Schneider et al. .......... 118/723 I

FOREIGN PATENT DOCUMENTS

| EP | 0 803 896 A2 | * 10/1997 | ............. H01J/37/32 |
| JP | 9-275092 | * 10/1997 | ....... H01L/21/3065 |

* cited by examiner

Primary Examiner—Gregory Mills
Assistant Examiner—Luz L. Alejandro
(74) Attorney, Agent, or Firm—FLynn, Thiel, Boutell & Tanis, P.C.

(57) ABSTRACT

An inner wall protection member used to protect the inner wall of a chamber of a plasma treatment apparatus which can be used stably for a long period of time by specifying properties of glass-like carbon materials, and a plasma treatment apparatus provided with the protection member. The hollow protection member for protecting the inner wall of a plasma processing chamber is integrally formed of glass-like carbon materials with a volume resistivity of $1 \times 10^{-2}$ Ω·cm or less and a thermal conductivity of 5 W/m·K or more. The protection member preferably has a thickness of 4 mm or more and the average surface roughness (Ra) of the inside of the hollow structure is preferably 2.0 μm or less. The plasma processing apparatus is configured so that the inner wall protection member having the above characteristics is arranged along the inner wall of the chamber of the plasma processing apparatus, wherein the inner wall of the chamber and the protection member are electrically connected and the chamber is grounded.

5 Claims, 2 Drawing Sheets

US 6,383,333 B1

PROTECTIVE MEMBER FOR INNER SURFACE OF CHAMBER AND PLASMA PROCESSING APPARATUS

TECHNICAL FIELD

The present invention relates to an inner wall protection member used to protect the inner wall of a chamber of a plasma processing apparatus, such as a plasma etching apparatus and a plasma CVD apparatus, for processing a silicon wafer in the fabrication of semiconductor devices such as ICs and LSIs, and to a plasma processing apparatus provided with the protection member.

BACKGROUND ART

A plasma processing apparatus used for plasma etching has upper and lower electrodes placed in a plasma processing chamber so as to face each other at a predetermined interval. Plasma is generated by discharging a reactive gas such as $CF_4$, $CHF_3$, Ar, and $O_2$ from orifices in the upper electrode and applying high-frequency electric power to the lower and upper electrodes. A silicon wafer or the like is placed on the lower electrode and is etched utilizing the plasma.

As a material for the electrodes, aluminum, graphite, glass-like carbon, silicon, and the like are used. As a material for the inner wall of the plasma processing chamber, aluminum, alumina in which the surface of aluminum is oxidized, and the like are used.

The inner wall of the plasma processing chamber is chemically eroded and generates dust, whereby the inner wall is worn out. The dust adheres to the surface of the wafer and this results in a defective wafer, thereby decreasing the yield. Moreover, the chamber tends to be damaged earlier. To deal with this problem, a protection member is provided on the inner wall of the plasma processing chamber to prevent the inner wall from being worn out due to plasma.

Japanese Patent Application Laid-open No. 9-275092 discloses a plasma processing apparatus having a chamber in which a substrate to be processed is installed, a pump used to exhaust the inside of the chamber, electrodes for generating plasma using processing gas introduced into the chamber thereby irradiating the plasma to the substrate, a replaceable protection wall provided along the inner wall of the chamber with a predetermined opening therebetween, and a cooling means for introducing cooling gas into the opening to prevent the temperature of the surface of the protection wall from increasing due to heat generated in the chamber.

The Japanese Patent Application Laid-open No. 9-275092 relates to a structure for cooling the protection wall provided in the chamber of the plasma processing apparatus, wherein the protection wall is caused to absorb polymers represented by $C_xF_y$ produced during plasma formation, thereby preventing the polymer from adhering to other areas of the chamber. Since this protection wall is easily replaced, the processing chamber can be efficiently cleaned. Moreover, since the increase in the temperature due to plasma of the surface of the protection wall can be prevented, stable processing is achieved.

Japanese Patent Application Laid-open No. 9-289198 discloses a plasma processing apparatus with a plasma processing chamber having electrodes for generating plasma, wherein at least the surface of the plasma processing chamber is formed of glass-like carbon in the area exposed to plasma excluding the electrodes. The Japanese Patent Application Laid-open No. 9-289198 also discloses a protection member for a plasma processing apparatus which is arranged in a plasma processing chamber provided with two electrodes for generating plasma, in which a plasma region is formed between the electrodes. The protection member is arranged so as to cover the plasma region between the electrodes, and at least the surface thereof facing the plasma region is formed of glass-like carbon.

According to the Japanese Patent Application Laid-open No. 9-289198, since the surface of the plasma processing chamber is formed of glass-like carbon in the area exposed to plasma, corrosion and wear due to plasma can be reduced. Moreover, the chamber can be used for a longer period of time due to low generation of particles (dust). Furthermore, contamination of the product to be processed due to dust can be prevented.

However, since plasma resistance of glass-like carbon materials varies depending on the properties thereof, such materials must be appropriately selected to obtain suitable performance as an inner wall protection member.

DISCLOSURE OF THE INVENTION

The present inventors have connected extensive studies on the properties of glass-like carbon materials suitably used for an inner wall protection member used to protect the inner wall of a chamber of a plasma processing apparatus. As a result, the present inventors have found that the glass-like carbon materials exhibit superior plasma resistance, generate only a small amount of dust, and are capable of generating and maintaining stable plasma. This finding has led to the completion of the present invention.

Specifically, an object of the present invention is to provide an inner wall protection member used to protect the inner wall of a chamber of a plasma processing apparatus which can be used in a stable manner over a long period of time, by specifying the properties of glass-like carbon materials, and a plasma processing apparatus provided with the protection member.

The inner wall protection member according to the present invention has a hollow structure and is integrally formed of glass-like carbon materials having a volume resistivity of $1 \times 10^{-2}$ $\Omega \cdot$cm or less and a thermal conductivity of 5 W/m·K or more. The protection member preferably has a thickness of 4 mm or more and the inner surface thereof preferably has an average surface roughness (Ra) of 2.0 $\mu$m or less. The hollow structure used herein includes a cylindrical shape and a cylindrical shape with a hole or groove formed therein. In addition, the hollow structure includes a hollow prism in addition to a cylindrical shape.

The plasma processing apparatus according to the present invention has a chamber and a hollow inner wall protection member integrally formed of glass-like carbon materials having a volume resistivity of $1 \times 10^{-2}$ $\Omega \cdot$cm or less and a thermal conductivity of 5 W/m·K or more, of which the thickness is preferably 4 mm or more and the inner surface has average surface roughness (Ra) of preferably 2.0 $\mu$m or less, wherein the inner wall of the chamber and the protection member are electrically connected and the chamber is grounded.

BEST MODE FOR CARRYING OUT THE INVENTION

Figure 1:
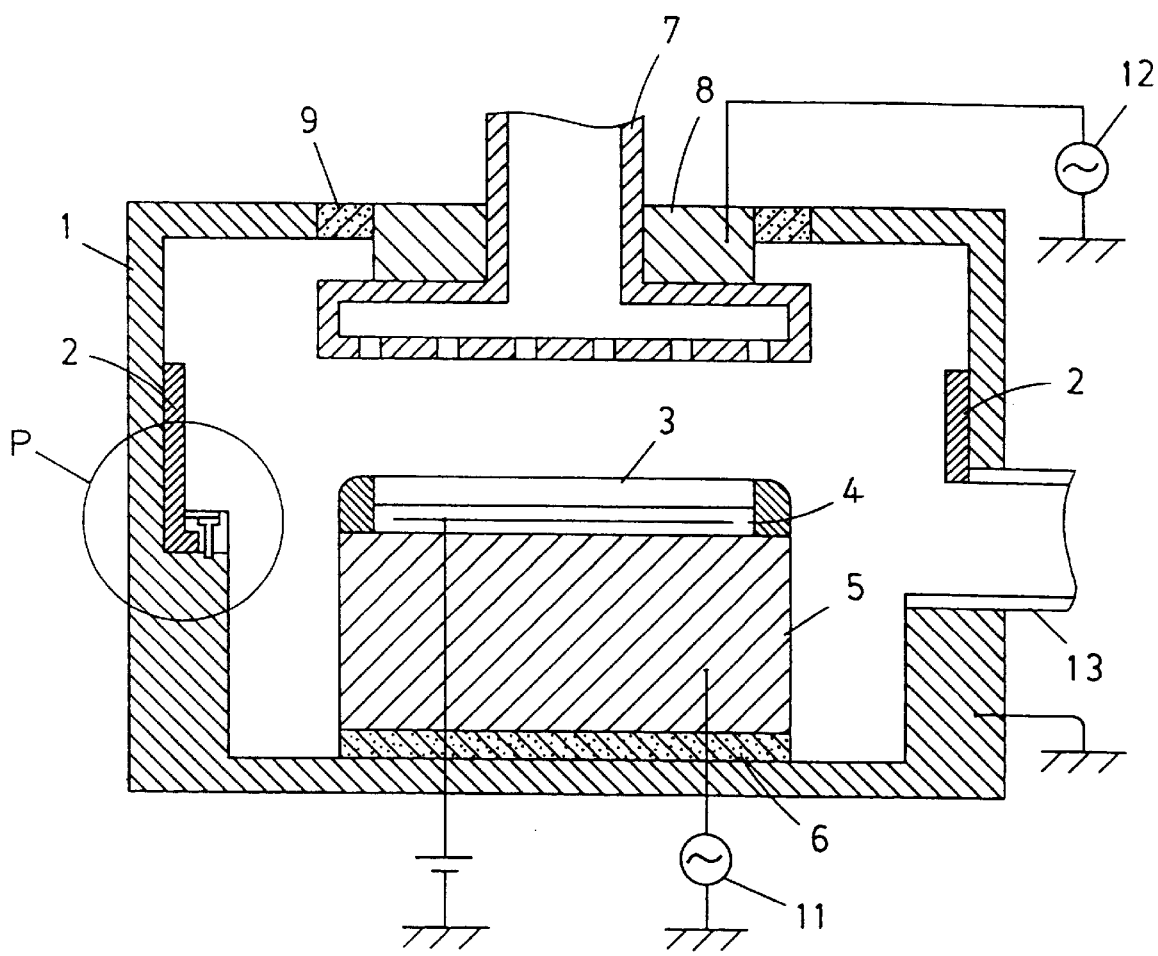
FIG. 1 shows a plasma processing apparatus.

Glass-like carbon materials are unique hard carbon substances having a fine hyaline structure. The substances are macroscopically nonporous and have a three-dimensional reticulated structure. The glass-like carbon materials excel in chemical stability, gas impermeability, abrasion resistance, surface smoothness, and solidity, in comparison with other carbon materials, and contain only a small amount of impurities.

In the present invention, glass-like carbon materials having a volume resistivity of $1\times10^{-2}$ $\Omega\cdot$cm or less and a thermal conductivity of 5 W/m·K or more is processed into a inner wall protection member with an integral hollow structure. Specifically, an opening for inserting and removing a wafer, an opening for monitoring, a groove for an exhaust tube, and the like are formed in the glass-like carbon materials to fabricate a protection member with an integral structure. The protection member preferably has a thickness of 4 mm or more and the inner surface thereof preferably has average surface roughness (Ra) of 2.0 $\mu$m or less.

If the volume resistivity exceeds $1\times10^{-2}$ $\Omega\cdot$cm, it is difficult to generate appropriate plasma due to the difference between the potential of the inner surface of the protection member and the grounded potential. If the thermal conductivity is less than 5 W/m·K, the difference in temperature between the inner surface of the protection member and the processing container which controls the temperature of the inner surface of the protection member increases, thereby requiring a longer period of time for adjusting the temperature. Moreover, it is difficult to generate stable plasma due to nonuniform temperature distribution. If the protection member has a separated structure instead of an integral structure, it is difficult to generate stable plasma due to the uneven potential of the inner surface of the protection member.

The protection member preferably has a thickness of 4 mm or more. If the thickness is less than 4 mm, electric resistance in the vertical direction increases when the protection member is arranged in the chamber, due to the decreased lateral cross section. As a result, the potential difference of the inner surface of the protection member in the vertical direction increases comparatively, whereby formation of appropriate plasma becomes difficult. The thickness is still more preferably 8 mm or more in order to improve durability.

The average surface roughness (Ra) of the inner surface of the hollow protection member is preferably 2.0 $\mu$m or less. The inner surface of the protection member is gradually worn out by the reaction with corrosive gas during plasma processing. If the average surface roughness (Ra) exceeds 2.0 $\mu$m, the inner surface of the protection member may fall off as particles depending on wear conditions. In addition, since the surfaces of the opening for inserting and removing a wafer, the opening for monitoring, the groove for an exhaust tube, and the like are also worn out during plasma processing, the average surface roughness (Ra) is preferably 2.0 $\mu$m or less.

The plasma processing apparatus of the present invention has a chamber and an inner wall protection member with an integral hollow structure formed of glass-like carbon materials having the above characteristics which is arranged along the inner wall of the chamber, wherein the inner wall of the chamber and the protection member are electrically connected, with the chamber being grounded. If the inner wall of the chamber and the protection member are not electrically connected and the chamber is not grounded, stable, uniform plasma processing becomes difficult due to unstable plasma. The electrical connection between the inner wall of the chamber and the protection member can be achieved by removing an aluminum oxide layer formed on the surface of the inner wall and allowing the bottom of the protection member to directly contact the aluminum material.

The glass-like carbon materials for forming the inner wall protection member of the present invention are manufactured as follows. In order to obtain high-density, high-purity glass-like carbon materials, purified phenol, furan, or polyimide thermosetting resins or blended resins of these having a carbon residual rate of 40% or more are used as raw materials. These raw material resins, either in the form of powder or liquid, are molded using an appropriate molding method such as die molding, injection molding, and cast molding depending on the type of resin to form a hollow molded product. The molded product is then cured at 100–250° C. in air. The cured product is filled in a graphite crucible, or a graphite plate carrying the molded product thereon is instead in an electric furnace or lead hammer furnace, and carbonized at 800° C. or more in a nonoxidizing atmosphere such as nitrogen or argon to obtain glass-like carbon materials.

The carbonized glass-like carbon materials are placed in a vacuum furnace of which the atmosphere is replaceable and hyper-purified by heating at 1500° C. or more in a stream of halogen purification gas such as chlorine gas. The hyper-purified glass-like carbon materials are machined using a hard tool such as a diamond tool and the inner surface thereof is ground to obtain the inner wall protection member for a chamber of the present invention.

The present invention will be described in more detail by examples and comparative examples.

EXAMPLES 1–3 AND COMPARATIVE EXAMPLES 1–3

A liquid phenol-formaldehyde resin ("PR940" manufactured by Sumitomo Durez Co., Ltd.) was filled in a mold made of polypropylene. The resin was degassed under reduced pressure of 10 Torr or less for 3 hours. The resin was put into an electric oven at 80° C. and allowed to stand for 3 days to obtain cylindrical molded product. The molded product was removed from the mold and was cured by heating at 100° C. for 3 days, 130° C. for 3 days, 160° C. for 3 days, and 200° C. for 3 days, respectively. The cured product was calcined and carbonized in an electric furnace at a temperature rising rate of 3° C./hr and heating temperature of 1000° C. in a nitrogen atmosphere.

The cured product was then hyper-purified in a vacuum furnace of which the atmosphere is replaceable while changing the heating temperature.

The glass-like carbon materials with different characteristics thus obtained were machined using a diamond tool and the inner surfaces thereof were ground to obtain hollow inner wall protection members with different surface roughness and thicknesses.

These inner wall protection members 2 were placed on the inner wall of a plasma processing chamber 1 shown in FIG.

Figure 2:
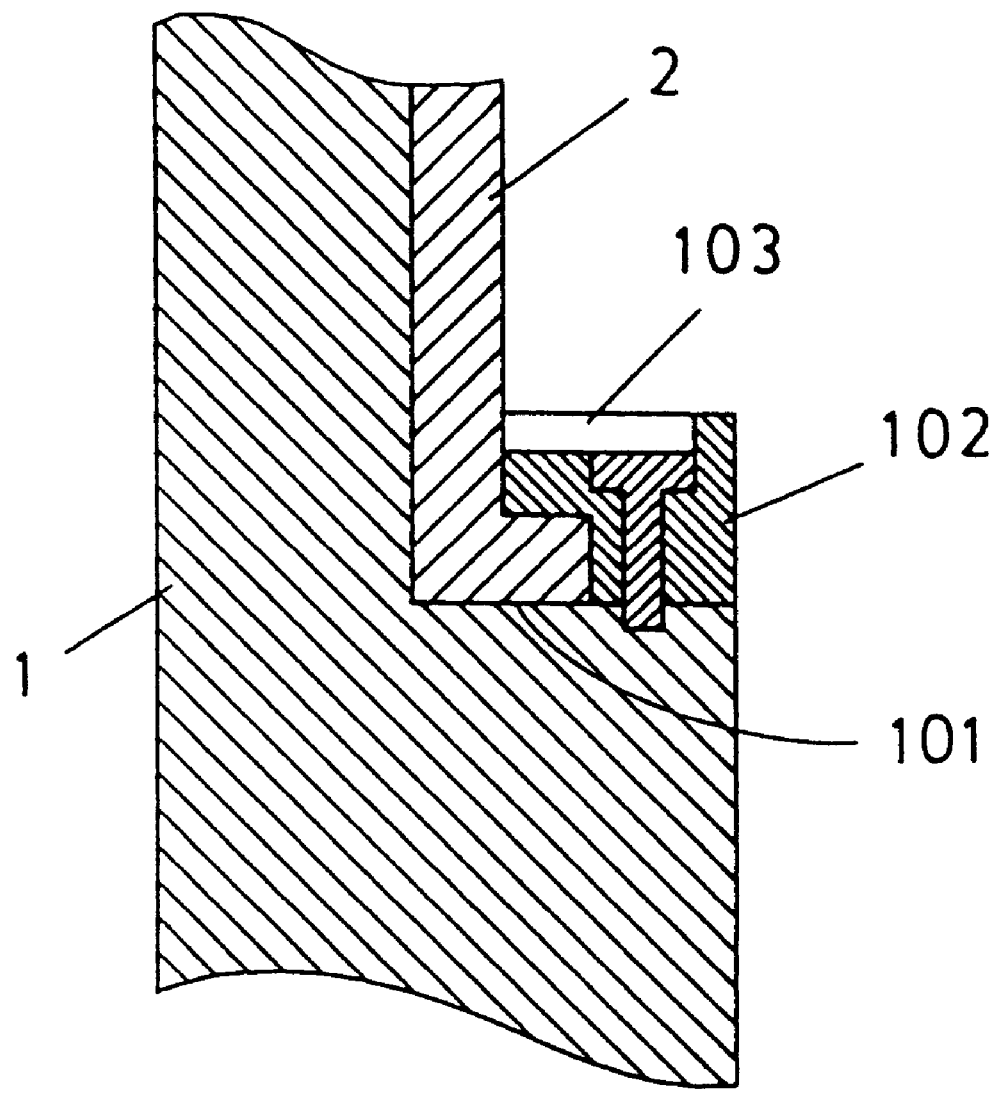
FIG. 2 shows an inner wall protection member which is electrically connected with a chamber at the bottom thereof.

1. The plasma processing chamber 1 made of aluminum of which the surface was oxidized was grounded. As shown in FIG. 2, which is an enlarged view of a portion "P" in FIG. 1, the inner wall protection member 2 was electrically connected with the plasma processing chamber at a bottom 101. The aluminum oxide layer on the surface of the plasma processing chamber was removed in the area in contact with the bottom 101. The projection of the bottom 101 of the inner wall protection member 2 was secured using an aluminum member 102 of which the surface was oxidized. Because of this, the inner wall protection member 2 was adequately connected at the bottom. A screw cover 103 was installed on a screw of the aluminum member 102 to prevent corrosion due to plasma.

A semiconductor wafer 3 was secured on a lower electrode 5 of the plasma processing chamber 1 using an electrostatic chuck 4. A high-frequency power supply (for example, 800 kHz) 11 was connected to the lower electrode 5. The lower electrode 5 was placed at the bottom of the plasma processing chamber 1 on an insulator 6. An upper electrode 7 was electrically connected with a conductor 8, and a high-frequency power supply (for example, 27.12 MHz) 12 was connected with the conductor 8. The conductor 8 and the plasma processing chamber 1 were arranged with an insulator 9 therebetween.

$C_4F_8$, $O_2$, and Ar were introduced from the top of the upper electrode 7 to the inside of the plasma processing chamber as processing gas. An $SiO_2$ film of the wafer 3 is etched using the plasma generated by applying high-frequency electric power from the upper and lower electrodes. The amount of dust and uniformity on the surface of wafers was measured after etching 100 sheets of wafers. The results are shown in Table 1. The surface uniformity is an index indicating the uniformity of the etching at the center and the edge of the wafer. The surface uniformity is calculated according to the following formula, provided that an etching rate at the center of the wafer is "A" and that at the end is "B". This is the proportion (in percentage) of the difference between the etching rate of the center and the end of the wafer in the average etching rate. The larger the absolute value of the surface uniformity, the less uniform the etching, and the smaller the absolute value, the more uniform the etching. In this measurement, wafers with a diameter of 200 mm were used.

$$\pm \frac{|A-B|}{A+B} \times 100 \ (\%)$$

TABLE 1

| Example No. | Hyper-purification temperature (° C.) | Volume resistivity ($10^{-2}$ Ω · cm) | Thermal conductivity (W/m · K) | Thickness (mm) | Average surface roughness Ra (μm) | Dust generation (number) | Surface uniformity (±%) |
|---|---|---|---|---|---|---|---|
| Example | | | | | | | |
| 1 | 2500 | 0.38 | 10.0 | 4.5 | 1.2 | 9 | 1.8 |
| 2 | 2200 | 0.45 | 8.0 | 5.0 | 0.5 | 7 | 2.1 |
| 3 | 1800 | 0.65 | 7.5 | 5.0 | 0.15 | 4 | 2.8 |
| Comparative Example | | | | | | | |
| 1 | 1200 | 1.85 | 3.5 | 5.0 | 0.9 | 8 | 4.2 |
| 2 | 1600 | 1.15 | 4.0 | 3.0 | 0.7 | 10 | 4.4 |
| 3 | 1700 | 1.05 | 4.5 | 5.0 | 7.8 | 102 | 3.6 |

As is clear from Table 1, the inner wall protection member in the examples which were formed of the glass-like carbon materials having the properties of the present invention generated a small amount of dust and exhibited etching uniformity on the surface in comparison with the comparative examples. The present invention can be applied to an LCD etching apparatus by forming the protection member as a prism. In the above examples, high-frequency electric power is applied to both the upper and lower electrodes. High-frequency electric power may be applied to only the upper electrode, and the lower electrode and chamber may be grounded. Alternatively, high-frequency electric power may be applied to only the lower electrode, and the upper electrode and chamber may be grounded.

INDUSTRIAL APPLICABILITY

As described above, the inner wall protection member formed of the glass-like carbon materials having specific properties of the present invention and the plasma processing apparatus provided with the protection member exhibit superior plasma resistance and ensure stable plasma processing for a long period of time.

What is claimed is:

1. A hollow protection member for protecting the inner wall of a plasma processing chamber of a plasma processing apparatus, which is integrally formed of glass-like carbon materials having a volume resistivity of $1\times10^{-2}$ Ω·cm or less and a thermal conductivity of 5 W/m·K or more.

2. The protection member according to claim 1, having a thickness of 4 mm or more.

3. The protection member according to claim 1, of which the inner surface has average surface roughness (Ra) of 2.0 μm or less.

4. A plasma processing apparatus comprising a chamber and the inner wall protection member according to claim 1 which is arranged along the inner wall of the chamber, wherein the inner wall of the chamber and the protection member are electrically connected, with the chamber being grounded.

5. The plasma processing apparatus according to claim 4, wherein the inner wall of the chamber and the protection member are electrically connected at the bottom of the protection member.

* * * * *